(12) United States Patent
Fukushima et al.

(10) Patent No.: US 10,774,231 B2
(45) Date of Patent: Sep. 15, 2020

(54) COMPOSITION FOR SINTERING, METHOD FOR PRODUCING SILVER NANOPARTICLES, CIRCUIT BOARD, AND METHOD FOR MANUFACTURING CIRCUIT BOARD

(71) Applicant: STANLEY ELECTRIC CO., LTD., Meguro-ku, Tokyo (JP)

(72) Inventors: Hiroto Fukushima, Tokyo (JP); Akihiko Hanya, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/459,925

(22) Filed: Jul. 2, 2019

(65) Prior Publication Data
US 2020/0010705 A1    Jan. 9, 2020

(30) Foreign Application Priority Data
Jul. 9, 2018    (JP) .................................. 2018-129747

(51) Int. Cl.
| | | |
|---|---|---|
| *H05K 1/09* | (2006.01) | |
| *H05K 3/14* | (2006.01) | |
| *C09D 11/52* | (2014.01) | |
| *B22F 1/00* | (2006.01) | |
| *B22F 1/02* | (2006.01) | |
| *B22F 9/16* | (2006.01) | |
| *H05K 3/12* | (2006.01) | |
| *H05K 1/02* | (2006.01) | |
| *C09D 11/037* | (2014.01) | |
| *H05K 1/18* | (2006.01) | |

(52) U.S. Cl.
CPC ............ *C09D 11/52* (2013.01); *B22F 1/0022* (2013.01); *B22F 1/02* (2013.01); *B22F 9/16* (2013.01); *C09D 11/037* (2013.01); *H05K 1/0204* (2013.01); *H05K 1/09* (2013.01); *H05K 3/1283* (2013.01); *B22F 2009/165* (2013.01); *B22F 2301/255* (2013.01); *B22F 2304/054* (2013.01); *H05K 1/181* (2013.01); *H05K 2201/0257* (2013.01); *H05K 2201/037* (2013.01); *H05K 2201/10106* (2013.01); *H05K 2203/1131* (2013.01)

(58) Field of Classification Search
CPC .......... H05K 1/09; H05K 1/092; H05K 1/095; H05K 1/097; H05K 3/14; H05K 3/143; H05K 3/146
See application file for complete search history.

(56) References Cited

U.S. PATENT DOCUMENTS

2017/0306170 A1* 10/2017 Leamon .................... B22F 9/20

FOREIGN PATENT DOCUMENTS

| JP | 2014055332 A | 3/2014 |
|---|---|---|
| JP | 2015011899 A | 1/2015 |

* cited by examiner

*Primary Examiner* — Jeremy C Norris
(74) *Attorney, Agent, or Firm* — Holtz, Holtz & Volek PC

(57) ABSTRACT

An object of the present invention is to provide a composition for sintering capable of suppressing a crack from occurring in a wiring after sintering. Provided is the composition for sintering including silver nanoparticles, an organic dispersant for coating the silver nanoparticles, and a solvent. When the composition for sintering is heated, a weight loss rate in a range of 260° C. to 600° C. is 2.92% or less.

21 Claims, 9 Drawing Sheets

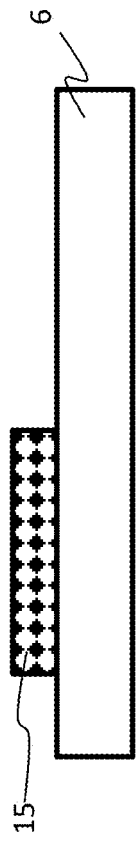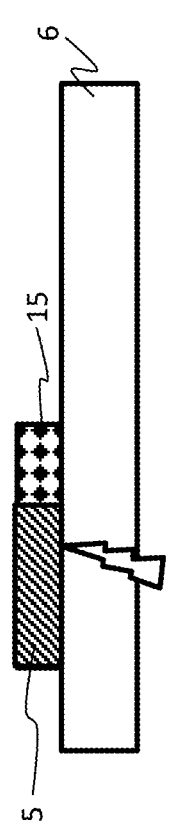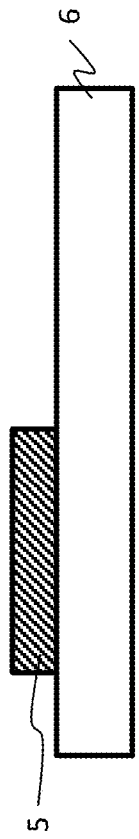

EXAMPLE 3 (24.0%)

COMPARATIVE EXAMPLE 1 (16.8%)

EXAMPLE 2 (15.7%)

EXAMPLE 5 (15.9%)

EXAMPLE 1 (8.8%)

EXAMPLE 4 (37.5%)

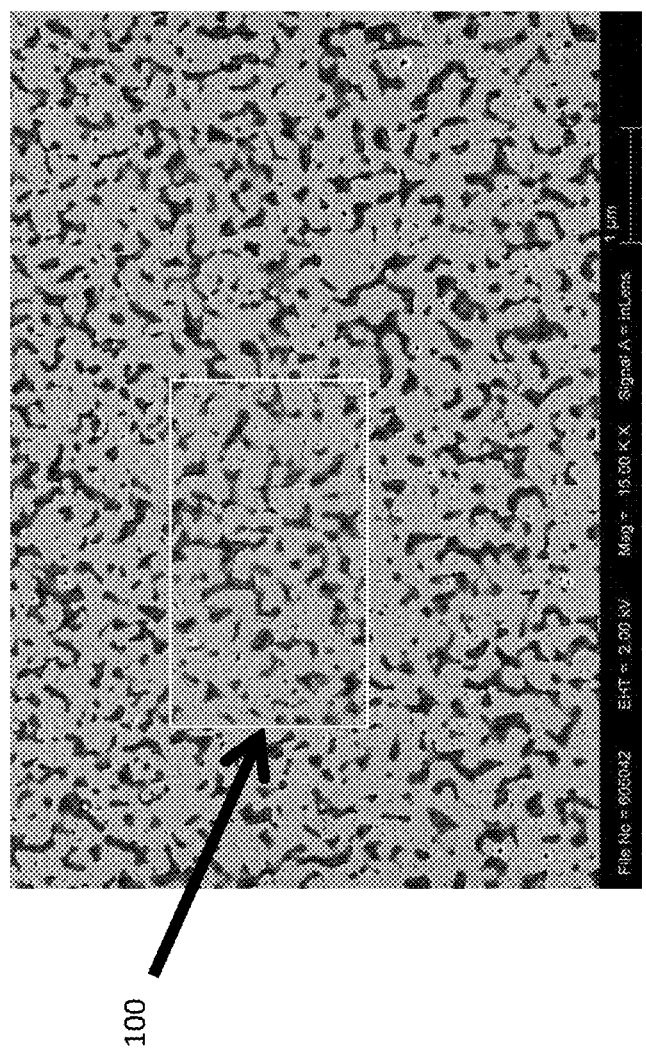

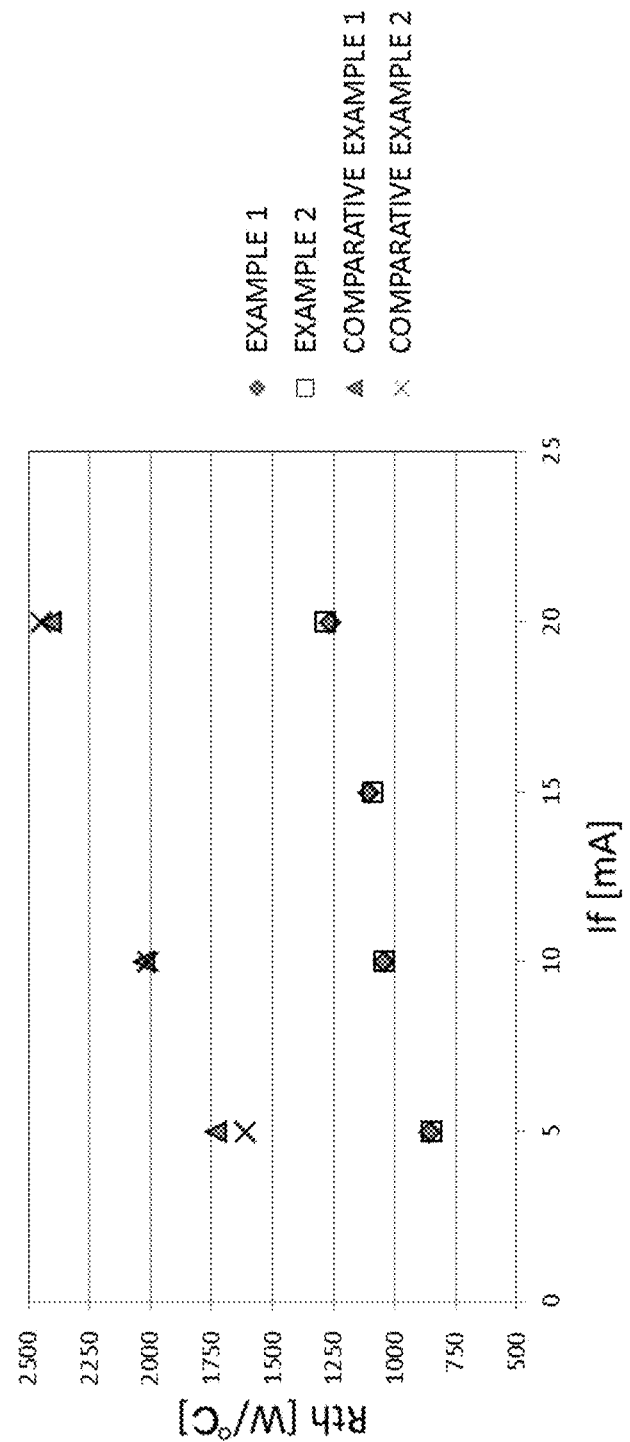

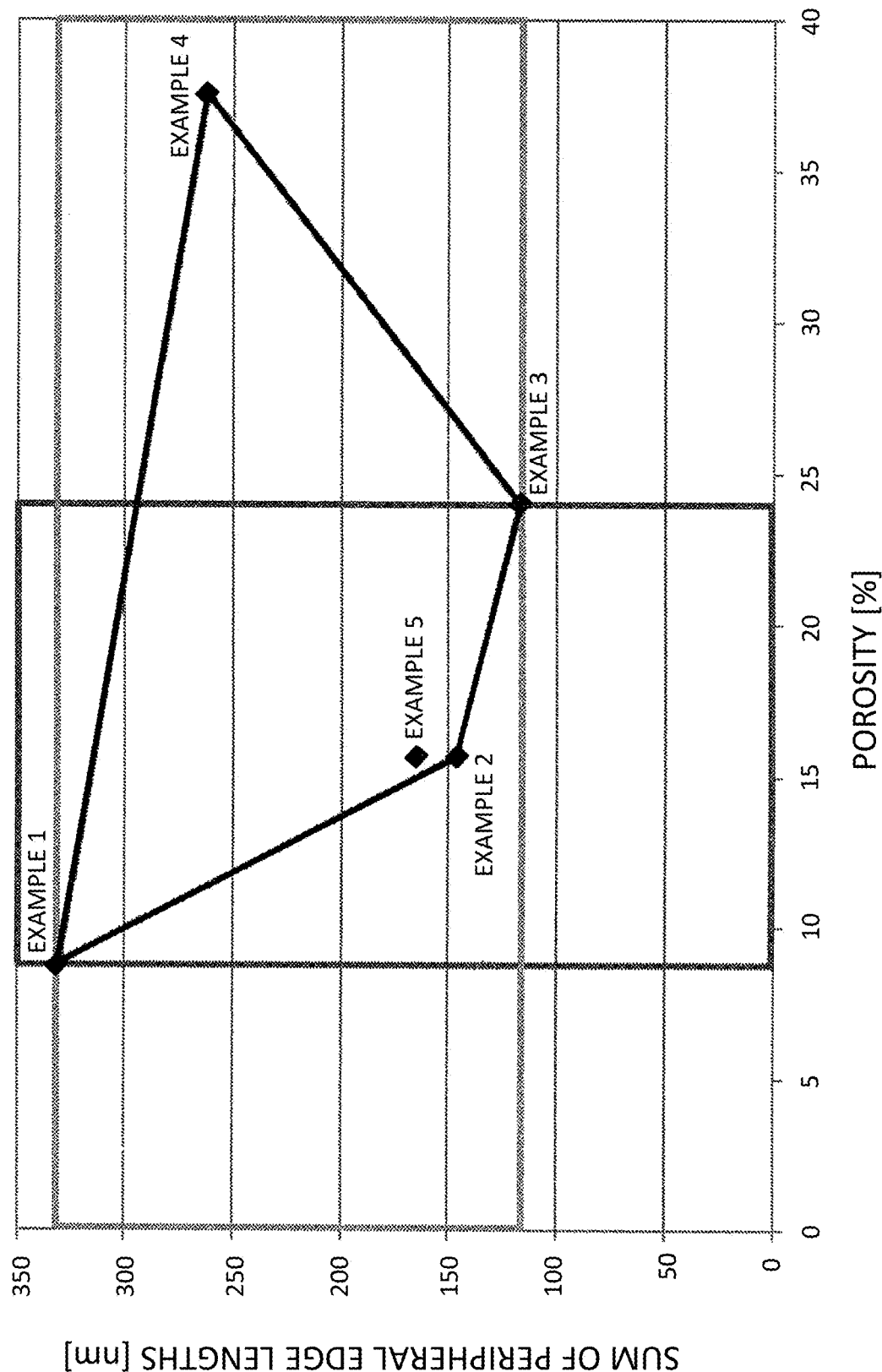

COMPOSITION FOR SINTERING, METHOD FOR PRODUCING SILVER NANOPARTICLES, CIRCUIT BOARD, AND METHOD FOR MANUFACTURING CIRCUIT BOARD

BACKGROUND OF THE INVENTION

1. Field of the Invention

The present invention relates to a technique for forming a wiring pattern by sintering a composition obtained by dispersing conductive particles in a solvent.

2. Background Art

There is known a technique in which a paste-like composition obtained by dispersing conductive particles in a solvent is applied to a base material and heated to evaporate the solvent and sinter the conductive particles, so that wiring or the like is formed on the base material. By using fine particles of several nm to several tens of μm as the conductive particles, the conductive particles can be sintered at a relatively low temperature, and thus it is also possible to use the base material made of resin.

JP-A-2014-55332 discloses that in order to prevent aggregation of the conductive particles during production, surfaces of the conductive particles are covered with an organic substance, and further the organic substance is substituted with a polymer dispersant having acidic and basic functional groups. JP-A-2014-55332 describes that it is possible to sinter the conductive particles at low temperature and to obtain the paste-like composition having an adequate adhesiveness to the base material in this way. Note that a degree of substitution is such that an exothermic peak due to thermal decomposition of the organic substance is not detected in result of differential thermal analysis of conductive fine particles.

Further, JP-A-2015-011899 discloses a paste in which a mixture of the conductive particles having an average primary particle diameter of 1 to 150 nm and the conductive particles having an average primary particle diameter of 1 to 10 μm in a predetermined ratio is dispersed in an organic solvent having reducibility in order to improve corrosion resistance while reducing volume contraction rate accompanying heating to suppress generation of cracks in a sintered body. Since the micro-sized conductive particles limit free movement of nano-sized conductive fine particles, the volume contraction rate is reduced to suppress coarse voids and cracks from occurring. Further, since the nano-sized conductive particles coated with an organic dispersant is used, an organic compound layer remains on a surface of the sintered body to improve the corrosion resistance.

SUMMARY OF THE INVENTION

In order to be able to supply a large current, it is desirable to form a thick film (for example, 10 μm or more thickness) wiring pattern by sintering the conductive particles. However, according to experiments of the inventors, when the composition (paste) obtained by dispersing the conductive particles in the solvent is thickly applied to a substrate and then sintered by heating to form a thick film wiring, it has been found that the cracks easily occur in the wiring and thermal shock resistance of the wiring is reduced.

Further, as in the technology of JP-A-2015-011899, a composition obtained by mixing the nano-sized conductive particles with micro-sized metal fine particles needs to have a high sintering temperature in order to sinter the micro-sized conductive particles, and it is necessary to use a material having high heat resistance as the material of the substrate.

An object of the present invention is to provide a composition for sintering capable of suppressing cracks from occurring in wiring after sintering.

In order to achieve the above object, according to the present invention, there is provided a composition for sintering, containing silver nanoparticles, an organic dispersant for coating the silver nanoparticles, and a solvent. When the composition for sintering is heated, a weight loss rate in a range of 260° C. to 600° C. is 2.92% or less.

Since the composition for sintering of the present invention is designed so that the weight loss rate in the range of 260° C. to 600° C. is 2.92% or less, it is possible to suppress the cracks from occurring in the wiring after sintering.

BRIEF DESCRIPTION OF THE DRAWINGS

FIGS. 1A to 1C are views for explaining a process for manufacturing a circuit board of an embodiment;

FIG. 6 is an image showing a state in which a region of a unit area is established on the cross-sectional image of the wiring produced using the composition for sintering of Example 3 and a peripheral edge length of a void is measured;

FIG. 7 is a graph showing results of measuring thermal resistances of the wirings produced using the compositions for sintering (conductive inks) of Examples 1 and 2 and Comparative Examples 1 and 2;

FIG. 9 is a graph plotting a cross-sectional porosity and a sum of peripheral edge lengths of voids per unit area of the wiring formed using the composition for sintering of each of Examples 1 to 5.

DESCRIPTION OF THE PREFERRED EMBODIMENTS

Figure 2:
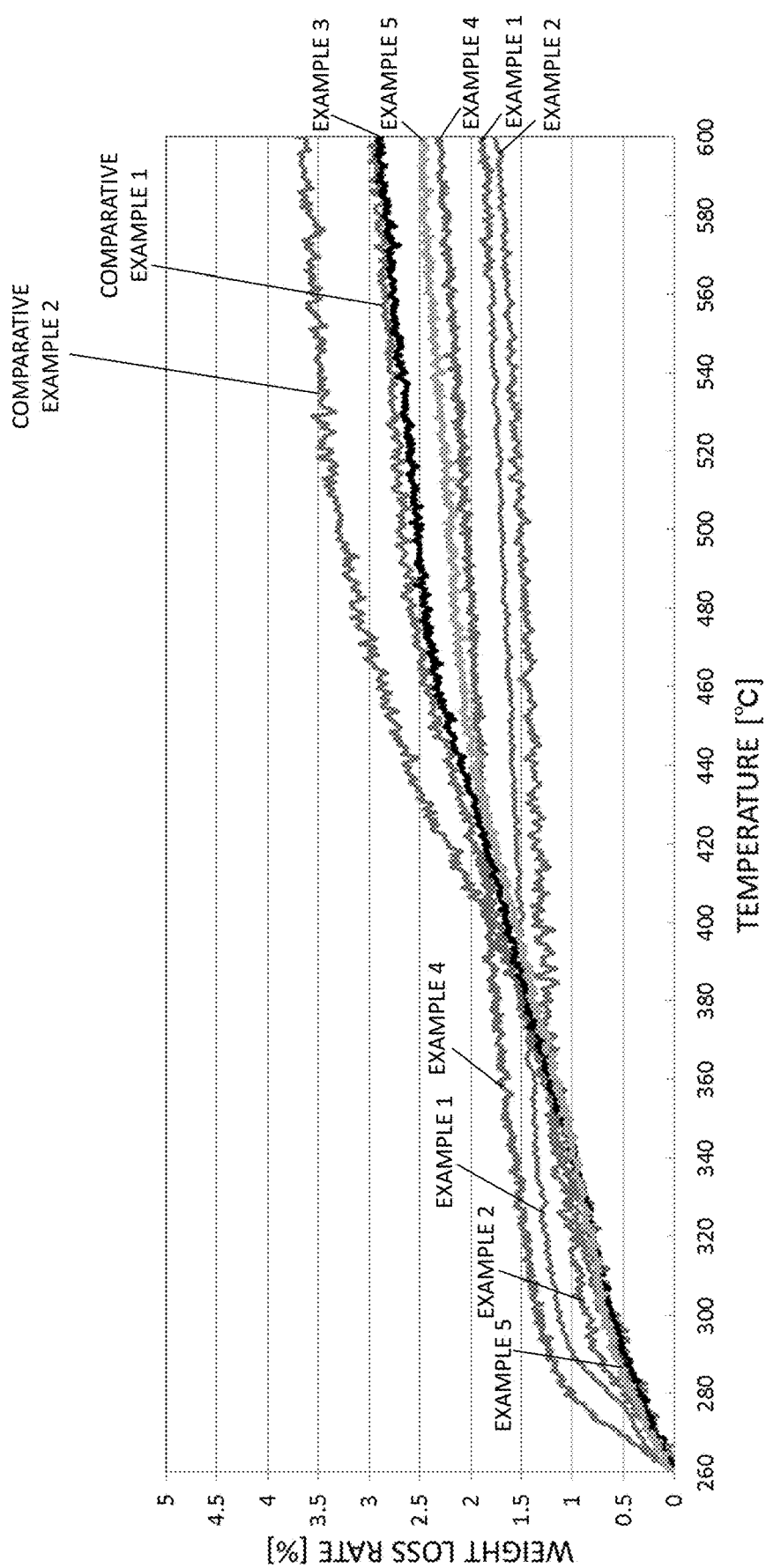
FIG. 2 is a graph showing weight loss rates of compositions for sintering of Examples 1 to 5 and Comparative Examples 1 and 2.

One embodiment of the present invention will be described below.

«Composition for Sintering»

A composition for sintering of the present embodiment will be described below. The composition for sintering of the present embodiment contains conductive particles, an organic dispersant for coating the conductive particles, and a solvent. When the composition for sintering is heated, a weight loss rate in a range of 260° C. to 600° C. is 2.92% or less.

The composition for sintering of such a structure can suppress cracks of a conductive sinter obtained by sintering.
<Conductive Particles>

For example, one or more of conductive metals and conductive metal oxides such as Au, Ag, Cu, Pd, ITO, Ni, Pt and Fe in the present embodiment can be used.

A maximum value of particle size distribution of the conductive particles is desirably 250 nm or less, and more desirably 200 nm or less.

Note that a particle size is calculated from an observation image measured by a field emission scanning electron microscope (FE-SEM).

A minimum value of the particle size distribution of the conductive particles is 50 nm or less, desirably 10 nm or less. Thus, since a ratio occupied by voids in a cross-section of the sinter is small, and a size of each void is also small, it is possible to reduce thermal resistivity and to improve heat dissipation of the sinter.
<Solvent>

As the solvent, glycols such as ethylene glycol, triethylene glycol and polyethylene glycol, organic solvents such as amines, alcohols, ethers, aromatics, ketones and nitriles, water and the like can be used.

A boiling point of the solvent is desirably less than 260° C. The boiling point of the solvent referred to here is, for example, a temperature at which a difference between temperatures, which are measured by a differential thermal analyzer, of the solvent and a reference substance is a peak.
<Organic Dispersant>

As the organic dispersant, polymers such as polyvinyl pyrrolidone and polyvinyl alcohol (PVA), amines, and compounds containing functional groups such as a hydroxyl group, a carboxyl group, an alkoxy group, a carbonyl group, an ester group, and a mercapto group can be used.
<Weight Loss Rate Due to Heating>

In the composition for sintering of the present embodiment, the weight loss rate in the range of 260° C. to 600° C. is desirably 2.92% or less, more desirably 2.46% or less, and still more desirably 2.30% or less. Reasons for this are not clear at present, however, it is considered that if an amount of high boiling point components contained in the composition for sintering is large, the cracks easily occur. Specifically, for example, the weight loss rate can be adjusted by adjusting an amount of the organic dispersant for coating the conductive particles.

The weight loss rate in the range of 260° C. to 600° C. is desirably measured by a thermogravimetric differential thermal analysis (TG/DTA) apparatus.
<Differential Thermal Analysis>

In the composition for sintering of the present embodiment, it is desirable that no exothermic peak appears in the range of 350° C. to 500° C. when differential thermal analysis is performed. Thus, it is possible to suppress the cracks from occurring. In addition, it is further desirable that two exothermic peaks appear in a range from the boiling point of the solvent to 300° C. Of the two exothermic peaks, it is desirable that the exothermic peak on the low temperature side is an exothermic peak which indicates at least evaporation of the solvent and partial evaporation of the organic dispersant, and the exothermic peak on the high temperature side is an exothermic peak which indicates sintering of the conductive particles. Reasons why they are desirable are not clear at present, however, since an absence of the exothermic peak in the range of 350° C. to 500° C. and an appearance of two exothermic peaks in the range from the boiling point of the solvent to 300° C. mean that the amount of high boiling point components contained in the composition for sintering is small, it is considered that the cracks are less likely to occur as in the case of the weight loss rate.

Differential thermal analysis is desirably measured by the thermogravimetric differential thermal analysis (TG/DTA) apparatus.
<Method for Producing Conductive Particles>

The method for producing the conductive particles according to the present embodiment desirably includes a step of depositing the conductive particles coated with the organic dispersant by preparing an organic dispersant solution obtained by dissolving the organic dispersant in the solvent, and by dropping a metal ion solution containing metal ions. By adjusting the amount of the organic dispersant dissolved in the solvent, it is possible to produce the conductive particles having a weight loss rate of 2.92% or less in the range of 260° C. to 600° C. when the composition for sintering is heated
<Circuit Board>

The composition for sintering of the present embodiment is applied to a substrate 6 to form a film 15 (FIG. 1A), and the conductive particles contained in the composition for sintering are sintered by heating the film 15 (FIG. 1B), so that a circuit board having a wiring 5 mounted on the substrate 6 can be manufactured (FIG. 1C). Since this wiring is obtained by sintering the composition for sintering of the present embodiment, occurrence of cracks is suppressed. As the heating method, a method for irradiating an electromagnetic wave such as light as shown in FIG. 1B can be used in addition to the heating using an oven or the like. When the substrate 6 has a characteristic of transmitting the electromagnetic wave such as light, it is possible to sinter the film 15 by irradiating the film 15 with the electromagnetic wave such as light through the substrate 6 as shown in FIG. 1B.

Further, this wiring contains voids between the sintered conductive particles and the conductive particles, and the ratio occupied by the voids in the cross-section of the wiring is 37.5% or less. The ratio occupied by the voids is desirably 24.0% or less, and more desirably 15.9% or less. The size of the voids is desirably 1.0 μm or less. Thus, since the thermal resistivity of the wiring is reduced, it is excellent in heat dissipation and is also low in electrical resistivity.

It is desirable that the ratio occupied by the voids in the cross-section of the wiring is 8.8% or more. Thus, a certain degree of flexibility can be exhibited, and the wiring can be deformed along with deformation of the substrate.
<Substrate>

As materials of the substrate used for the circuit board, a metal having a surface coated with an insulating layer, or the like can be used in addition to polyimide, polyethylene terephthalate (PET), polyethylene naphthalate (PEN), polycarbonate (PC), liquid crystal polymer, glass epoxy, paper phenol, ceramic, glass-containing silicone glass, glass or the like.

EXAMPLES

Examples 1 to 5 of the present invention will be described below.
<Synthesis of Silver Nanoparticles>

First, silver nanoparticles were synthesized as the conductive particles used for compositions for sintering of Examples 1 to 5 and Comparative Examples 1 and 2. The silver nanoparticles are coated with polyvinyl pyrrolidone, which is the organic dispersant, at a surface thereof in order to prevent aggregation.

The silver nanoparticles were synthesized by polyol method. First, polyvinyl pyrrolidone (molecular weight:

20000, referred to as PVP) having a weight shown in Table 1 and 100 g of diethylene glycol as the solvent are stirred to dissolve the PVP in the solvent, and this PVP solution is heated at 140° C. to 150° C.

6 g of silver nitrate and 20 g of diethylene glycol were stirred to dissolve the silver nitrate in diethylene glycol and prepare a silver ion-containing solution. The silver ion-containing solution was dropped into the heated PVP solution.

After dropping, the mixture was gradually cooled to room temperature to synthesize PVP-coated silver nanoparticles. The synthetic solution was centrifuged with ethanol to obtain the PVP-coated silver nanoparticles. Centrifugation is performed to remove unwanted matter, and methods such as filtration can also be used.

Thus, the PVP-coated silver nanoparticles used for the compositions for sintering of Examples 1 to 5 and Comparative Examples 1 and 2 were produced.

<Production of Composition for Sintering>

The PVP-coated silver nanoparticles were dropped and mixed in polyethylene glycol (average molecular weight 200) which is the solvent to have a concentration of 90 wt %. Processing by a shaking apparatus, a roll mill, a shaker or vacuum stirring was performed as needed.

Thus, the compositions for sintering (hereinafter also referred to as conductive inks) containing 90 wt % of the PVP-coated silver nanoparticles in polyethylene glycol of Examples 1 to 5 and Comparative Examples 1 and 2 were prepared. The composition for sintering of each of Examples 1 to 5 and Comparative Examples 1 and 2 is composed of the silver nanoparticles, the PVP which coated surfaces of the silver nano particles and was added during synthesis of the silver nanoparticles, residue of the PVP, and the polyethylene glycol (average molecular weight 200: PEG 200) as the solvent.

The compositions for sintering of Examples 1 to 5 and Comparative Examples 1 and 2 were produced under the same conditions except for a weight of PVP used during manufacturing the silver nanoparticles.

The compositions of Examples 1 to 5 are as described above, however, it is also possible to change the composition in a range such that the weight of silver (metal) is 20 wt % to 95 wt %, the weight of solvent is 5% to 70%, and the weight of dispersant is 0.01% to 10%.

TABLE 1

| | Amount of PVP [g] | Particle diameter [nm] | Weight loss rate by TG (%) (260° C. to 600° C.) | DTA peak ("Good" means two peaks in 200° C. to 300° C., and no exothermic peak in 350° C. to 500° C.) | Crack | Resistivity [μΩ · cm] |
|---|---|---|---|---|---|---|
| Example 1 | 6 | 10 to 100 | 1.84 | Good | No | 5.0 |
| Example 2 | 8 | 10 to 100 | 1.78 | Good | No | 5.1 |
| Example 3 | 10 | 10 to 100 | 2.92 | Good | No | 5.8 |
| Example 4 | 2 | 50 to 200 | 2.30 | Good | No | 8.0 |
| Example 5 | 10 | 10 to 250 | 2.46 | Poor | No | 5.5 |
| Comparative Example 1 | 12 | 10 to 100 | 2.96 | Poor | Yes | 5.2 |
| Comparative Example 2 | 40 | 10 to 100 | 3.72 | Poor | Yes | 9.8 |

| | Wiring thermal shock resistance | Wiring heat dissipation | Cross-sectional porosity [%] | Size of void (μm) | Reciprocal of sum of peripheral edge lengths of voids in unit area of cross-section (1/nm) |
|---|---|---|---|---|---|
| Example 1 | Good | Good | 8.8 | 1.0 or less | $3.02 \times 10^{-3}$ (=331 nm) |
| Example 2 | Good | Good | 15.7 | 1.0 or less | $6.87 \times 10^{-3}$ (=146 nm) |
| Example 3 | Good | Good | 24.0 | 1.0 or less | $8.55 \times 10^{-3}$ (=117 nm) |
| Example 4 | Good | Poor | 37.5 | 2.5 or less | $3.81 \times 10^{-3}$ (=262 nm) |
| Example 5 | Poor | Good | 15.9 | 1.0 or less | $6.18 \times 10^{-3}$ (=162 nm) |
| Comparative Example 1 | Good | Good | 16.8 | 1.0 or less | $6.95 \times 10^{-3}$ (=144 nm) |
| Comparative Example 2 | Poor | Good | — | 1.0 or less | — |

<Measurement of Particle Size>

The silver nanoparticles of Examples 1 to 5 and Comparative Examples 1 and 2 were photographed at a magnification of about 10,000 to 100,000 with the field emission scanning electron microscope (FE-SEM), and the obtained images were analyzed to measure the particle size of the silver nanoparticles. The minimum value and the maximum value of the measured particle size distribution are shown in Table 1.

<Thermal Analysis with TG/DTA Apparatus>

The compositions for sintering (conductive inks) of Examples 1 to 5 and Comparative Examples 1 and 2 were heated at a heating rate of 5° C./min, and the weight loss rate in the range of 260° C. to 600° C. and a calorific value in the range of 100° C. to 600° C. were respectively measured by the TG/DTA apparatus.

A graph of measurement results of the weight loss rate by TG is shown in FIG. 2. Further, the weight loss rate in the range of 260° C. to 600° C. is shown in Table 1.

Figure 3:
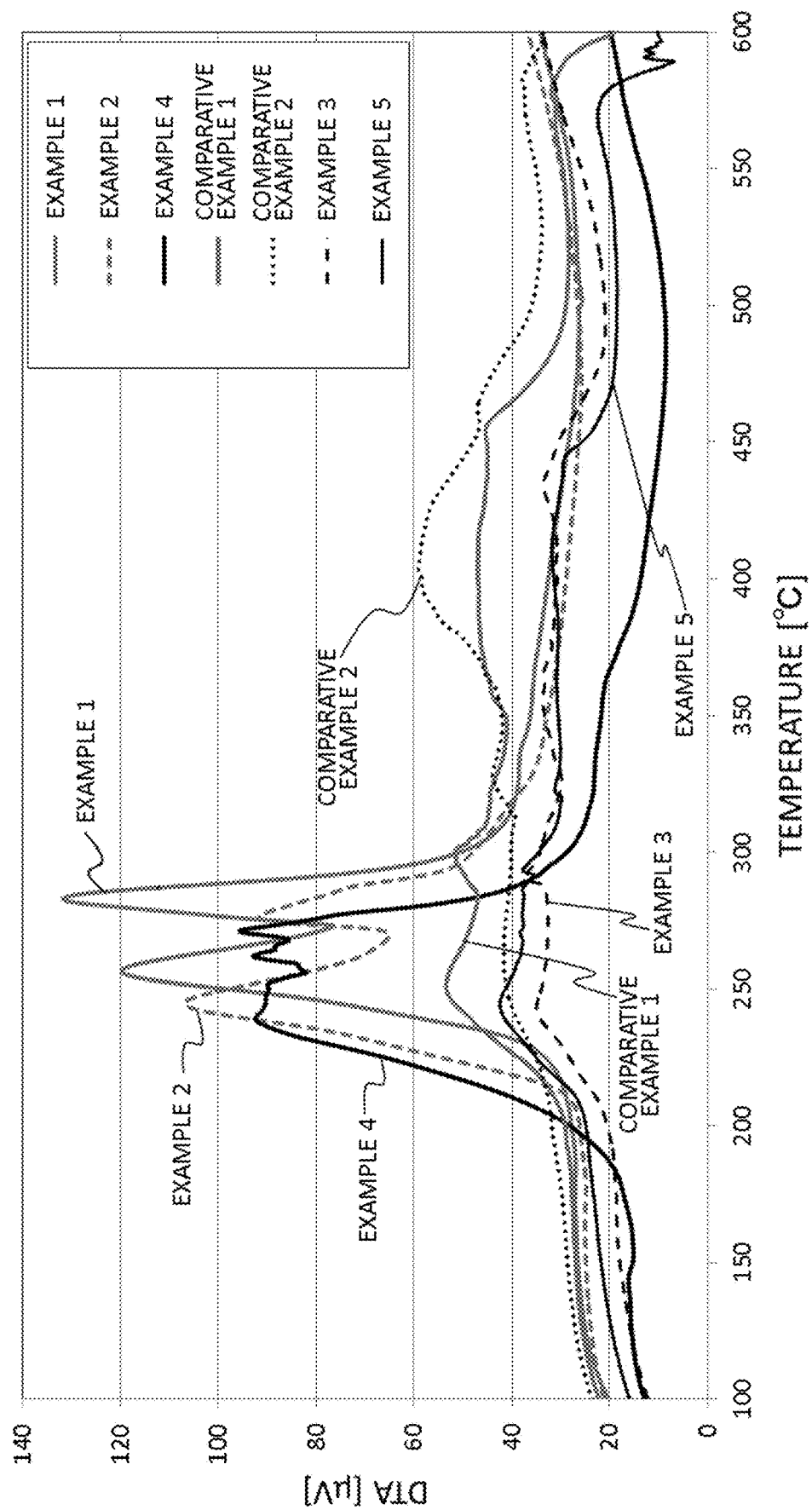
FIG. 3 is a graph showing results of measuring calorific values by DTA analysis of the compositions for sintering of Examples 1 to 5 and Comparative Examples 1 and 2.

The graph of the measurement results of the calorific value by DTA is shown in FIG. 3. Further, in the graph of FIG. 3, those having two exothermic peaks in the range of 200° C. to 300° C. and having no exothermic peak in the range of 350° C. to 500° C. are indicated as "Good", and others are indicated as "Poor" in Table 1.

Figure 4:
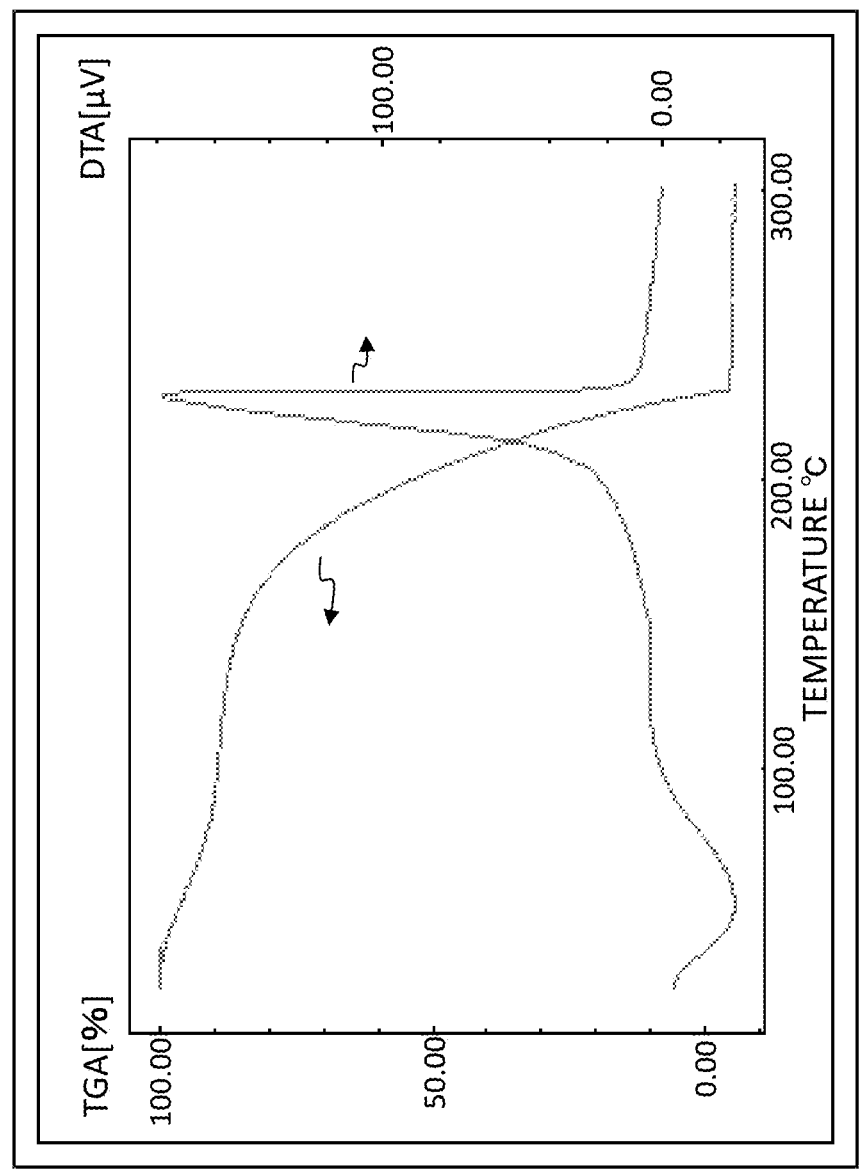
FIG. 4 is a graph showing measurement results of solvent alone by TG/DTA.
Figure 5C:
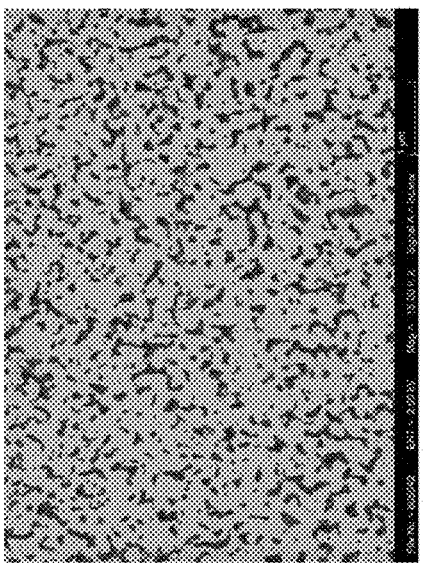
FIGS. 5A to 5F are cross-sectional images of wirings produced using the compositions for sintering (conductive inks) of Examples 1 to 5 and Comparative Example 1.
Figure 5F:
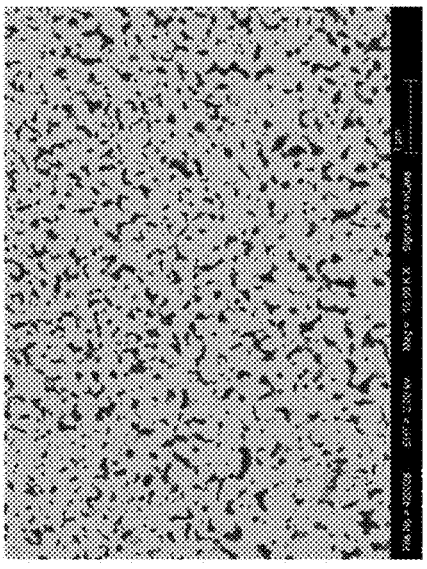
Figure 5B:
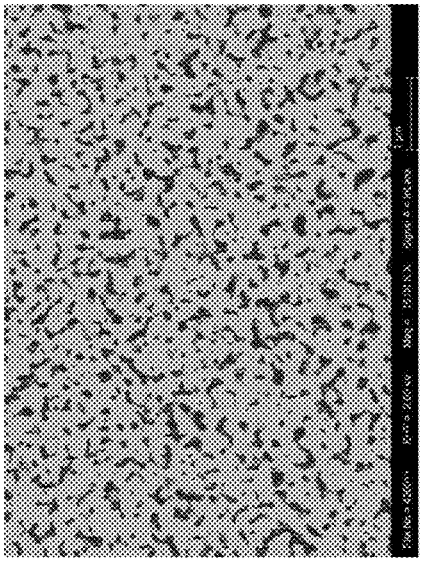
Figure 5E:
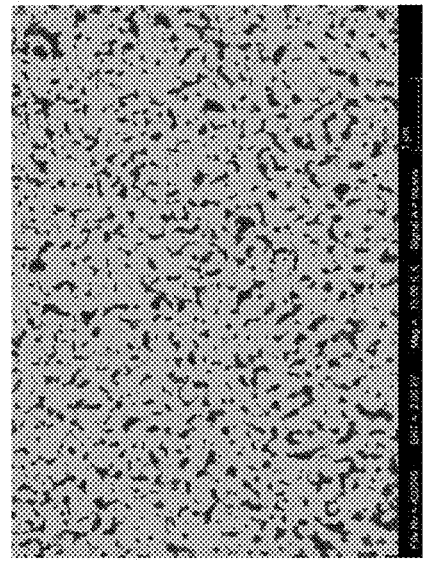
Figure 5A:
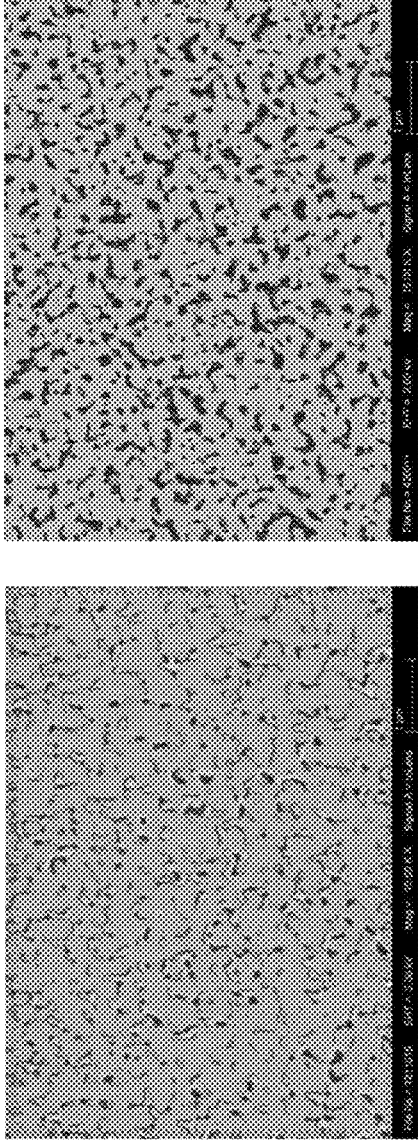
Figure 5D:
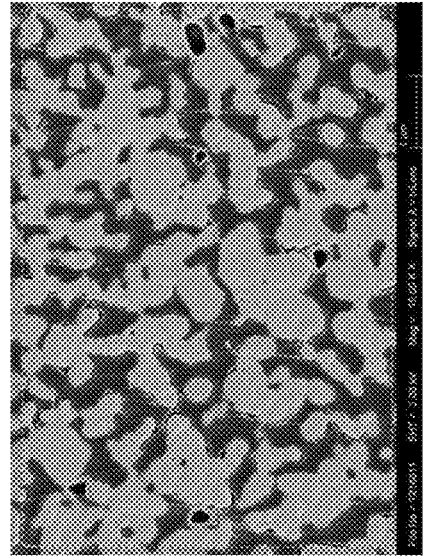

Further, the measurement results by TG and the measurement results by DTA of only polyethylene glycol (average molecular weight 200) which is the solvent are shown in FIG. 4. As shown in FIG. 4, in the case of the solvent alone, the exothermic peak is around 230° C.

<Presence of Crack>

The compositions for sintering (conductive inks) of Examples 1 to 5 and Comparative Examples 1 and 2 were coated on a polyimide substrate to a thickness of 15 μm, a width of 200 μm, and a length of 50 mm, and heated at 200° C. for 60 minutes to be sintered. The sinter was observed with the microscope to check whether any cracks occurred. The results are shown in Table 1.

<Manufacture of Circuit Board>

The composition for sintering (conductive ink) of each of Examples 1 to 5 and Comparative Examples 1 and 2 was applied on the surface of a light transmitting polyimide substrate to a thickness of 15 μm and a width of 400 μm to form a film, and the film was irradiated with the electromagnetic wave such as laser light or flash light from the back surface side of the substrate through the substrate. Thus, the electromagnetic wave such as light was irradiated to the silver nanoparticles of the composition for sintering, the film of the composition for sintering and the circuit board in the periphery thereof were intensively heated, and the silver nanoparticles in the film were sintered, so that the wiring which was a sintered body was formed. At this time, apart of a portion of the light transmitting substrate to which the electromagnetic wave was irradiated was melted and solidified again in a state of entering a part of the wiring, so that the substrate and the wiring were firmly bonded. In addition, a part of the organic dispersant (PVP) entered between the wiring and the circuit board to function as an adhesive.

As described above, the circuit board including the wiring formed by sintering the composition for sintering (conductive ink) of each of Examples 1 to 5 and Comparative Examples 1 and 2 was manufactured.

In the circuit board, the film of the composition for sintering (conductive ink) and portions other than the periphery thereof remained unmolten.

<Electric Resistivity>

The wiring of the circuit board manufactured as described above using the composition for sintering (conductive ink) of each of Examples 1 to 5 and Comparative Examples 1 and 2 was supplied with current, and the electrical resistivity was measured. The measurement results are shown in Table 1.

<Thermal Shock Resistance of Wiring>

The circuit board manufactured as described above using the composition for sintering (conductive ink) of each of Examples 1 to 5 and Comparative Examples 1 and 2 was heated from −40° C. to 120° C. and held for 15 minutes, and cooled to −40° C. and held for 15 minutes. This was regarded as one cycle and repeated for 1000 cycles, and then it was observed with the microscope whether the wiring had a crack. The results are shown in Table 1 with "Good" for a non-cracked one and "Poor" for a cracked one.

<Wiring Heat Dissipation>

A device was manufactured in which one LED was mounted on the circuit board obtained by forming the wiring as described above using the composition for sintering (conductive ink) of each of Examples 1 to 5 and Comparative Examples 1 and 2. A thermal resistance value (Ta=85° C.) when 10 mA current was applied to the device was measured, and those exceeding 2000° C./W were determined to be "Poor", and those not exceeding 2000° C./W were determined to be "Good". It is considered that Example 4 determined to be "Poor" was not good in heat dissipation, because a cross-sectional porosity was as high as 37.5% as compared with Examples 1 to 3 and 5 and Comparative Examples 1 and 2.

<Cross-Sectional Porosity, Size of Void, and Sum of Peripheral Edge Lengths of Voids>

The wiring of the circuit board manufactured as described above using the composition for sintering (conductive ink) of each of Examples 1 to 5 and Comparative Examples 1 and 2 was cut, and the image of the cross-sections was taken. FIGS. 5A to 5F show cross-sectional images of the wirings produced using the compositions for sintering (conductive inks) of Examples 1 to 5 and Comparative Example 1.

Further, the cross-sectional image of the wiring was analyzed by an image analysis and measurement software (WinROOF2015 (manufactured by Mitani Corporation)), to determine an area of the void of the cross-section and calculate the cross-sectional porosity. The size of the voids was also calculated. Further, as shown in FIG. 6, the peripheral edge lengths of all the voids present in an area 100 of the unit area (2500 nm square) of the cross-section were measured, and their sum was determined. FIG. 6 is an image in which the peripheral edge length of Example 3 is measured as an example. The measurement results of the cross-sectional porosity, the size of the voids, and the sum of the peripheral edge lengths of the voids are shown in Table 1.

<Evaluation>

According to Table 1, the compositions for sintering of Examples 1 to 5 in which the weight loss rate in the range of 260° C. to 600° C. is 2.92% or less did not have cracks when sintered. In contrast, in Comparative Examples 1 and 2 in which the weight loss rate in the range of 260° C. to 600° C. is greater than 2.92, the crack occurred.

In Examples 1 to 3 and 5 and Comparative Example 1 in which the minimum value of the particle size distribution of the conductive particles is less than 50 nm (10 nm), the porosity of the wiring of the sintered body was less than 37.5% (16.8% or less), and they were excellent in heat dissipation.

The wiring formed using the composition for sintering has small-sized voids contained therein, and the flexibility is improved as the number of voids per unit area is large. When the size of the voids is small and the number of voids per unit area is large, the sum of the peripheral edge lengths of the voids per unit area tends to be large. In Examples 1 to 3 and 5 using the silver nanoparticles having a particle size minimum value of less than 50 nm (10 nm), the size of the voids of the formed wiring and the sum of the peripheral edge lengths of the voids per unit area have numerical values shown in Table 1, and the flexibility can be expected. It can also be confirmed by a photograph of the cross-section in FIG. 5A to 5C and 5E that the size of the void of the wiring of Examples 1 to 3 and 5 is small and the number of voids per unit area is large. Specifically, it is confirmed that the sum of the peripheral edge lengths of the voids per unit area (2500 nm square) can be 117 nm or more, preferably 146 nm or more, more preferably 162 nm or more, and can be increased to 331 nm. In Examples 1, 2 and 3, an amount of PVP, which is one of the conditions when producing the composition for sintering, is mutually changed. On the other hand, Example 4 is different from Examples 1, 2 and 3 in the amount and particle size of PVP among the conditions when producing the composition for sintering. When the porosity is X and the sum of the peripheral edge lengths is Y, values of Examples 1 to 5 are plotted on XY plane coordinates as shown in the graph of FIG. 9. From FIG. 9, the composition for sintering in a range surrounded by four points of (porosity (%), sum of peripheral edge lengths (nm))=(X, Y)=(8.8, 331), (15.7, 146), (24.0, 117), and (37.5, 262) can be produced by changing the amount of PVP in a range of 2 to 10 g and the particle size of the silver nanoparticle in a range of 10 to 200 nm, as apparent from Table 1. Further, even the composition for sintering, in which the wiring having the cross-sectional porosity and the size of the void outside the range surrounded by the above four points is formed, can be produced by optimizing the conditions such as the amount of PVP and the particle size.

As shown in Table 1, the thermal shock resistance (heat shock resistance) of Examples 1 to 4 and Comparative Example 1 was excellent.

Further, in Examples 1 to 4 in which the exothermic peak does not appear in the range of 350° C. to 500° C., and the two exothermic peaks appear in the range of 200° C. to 300° C. by DTA analysis, the weight loss rate in the range of 260° C. to 600° C. by TG analysis was also relatively small.

Regarding the two exothermic peaks, according to the results of thermal analysis DTA, it is considered that the evaporation of the solvent causes the evaporation of PVP which has suppressed sintering, so that a first exothermic peak appears, and the sintering of the particles starts due to further rise of the temperature, so that a second exothermic peak appears. Positions of the two exothermic peaks differ depending on the amount of PVP, however, it is common that the two exothermic peaks appear in the range of 200° C. to 300° C. and are close to each other, and there is no exothermic peak at 350° C. or higher. From this, it is considered that Examples 1 to 4 have a low content of high boiling point PVP, and the evaporation of the solvent and the sintering of the particles occur almost simultaneously in a narrow temperature range, and thus it is considered that the cracks do not easily occur in Examples 1 to 4. On the other hand, in Comparative Examples 1 and 2 in which the exothermic peak is observed at 350° C. or higher, it is considered that the solvent is evaporated at 300° C. or lower, but the sintering of the particles is not completed, and the cracks easily occur.

<Thermal Resistance Measurement and Moisture Resistance Energization Test>

For checking performance, an experiment of thermal resistance measurement and a moisture resistance energization test were performed on the composition for sintering (conductive ink) of each Example.

First, a sample in which one LED was mounted on the circuit board manufactured as described above using each of Examples 1 and 2 and Comparative Examples 1 and 2 was manufactured. The current was supplied to each of these samples and the thermal resistance was measured. The results are shown in the graph of FIG. 7. As is apparent from FIG. 7, in the wiring obtained by sintering the composition for sintering (conductive ink) of each of Examples 1 and 2, the thermal resistance could be reduced by about 50% in the range of 5 to 20 mA as compared with Comparative Examples 1 and 2.

Figure 8B:
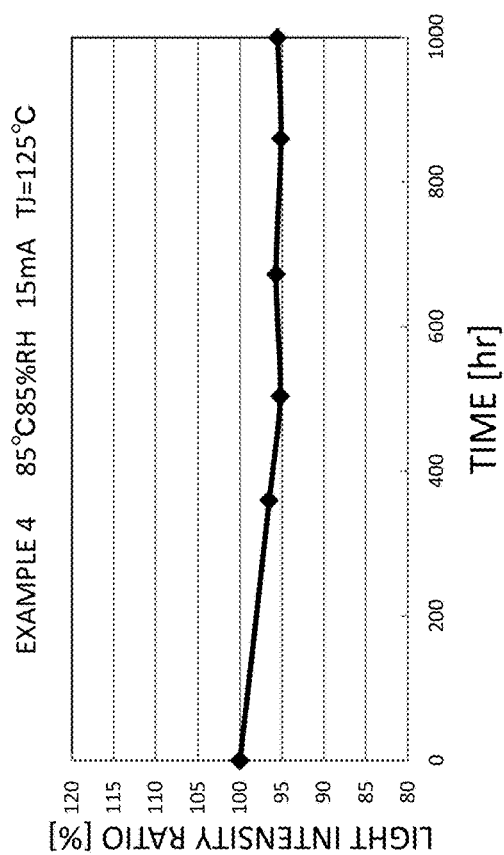
FIGS. 8A and 8B are graphs each showing a moisture resistance energization test result of a device in which an LED is mounted on the circuit board obtained by forming the wiring using the composition for sintering (conductive ink) of each of Example 1 and Example 4.
Figure 8A:
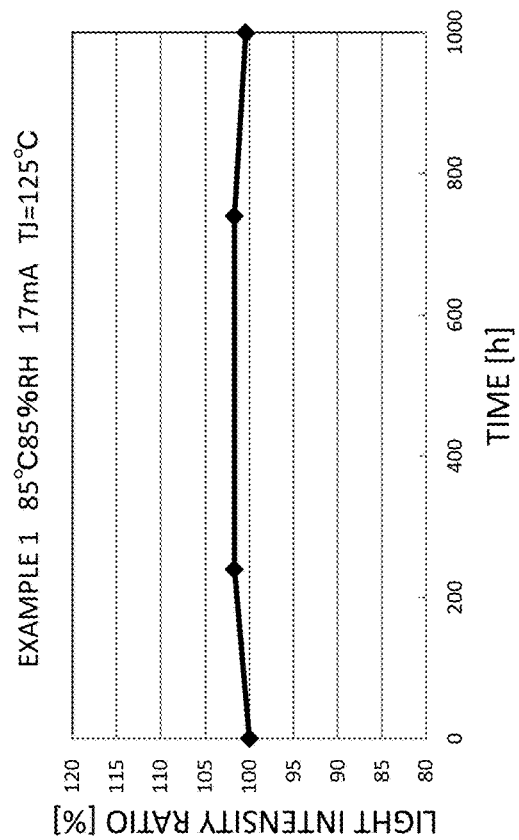

On the other hand, a device was manufactured in which nine LEDs (3×3 array, 1 mm pitch) were mounted on the circuit board obtained by forming the wiring as described above using the composition for sintering (conductive ink) of each of Example 1 and Example 4. By supplying 17 mA current to the LED for the device of Example 1, and 15 mA current for the device of Example 4, the moisture resistance energization test was performed in which the LED was lit at a temperature of 85° C. and a humidity of 85% (TJ=125° C. (Ta=85° C.)). (Where, TJ is a junction temperature of the LED, and Ta is an ambient temperature.) A change over time of light intensity ratio when an initial brightness at a start of lighting was 100% was measured. The results are respectively shown in FIGS. 8A and 8B. As shown in FIGS. 8A and 8B, the light intensity was 100% even after 1000 hours in Example 1. The light intensity was maintained at 95% after 1000 hours in Example 4. A reason for the difference in light intensity ratio between Example 1 and Example 4 is thought that the wiring of Example 1 has a lower cross-sectional porosity than the wiring of Example 4 and is excellent in heat dissipation.

In the description of the embodiment and Examples described above, the circuit board on which the wiring is formed by applying the composition for sintering of the present embodiment on the substrate and heating it has been described, however, a target for forming the wiring is not limited to a plate-like circuit board, and the wiring can be formed on the substrate of any shape.

Further, in the description of the embodiment and Examples described above, although the maximum value of the particle size of the conductive particles contained in the composition for sintering has been described, the particles exceeding the maximum value of the particle size may be partially contained within a range of error, and it goes without saying that the scope of rights of the present application also extends to such a composition for sintering.

Since the composition for sintering (conductive ink) of the embodiment and Examples described above is unlikely to crack, has a low electrical resistivity, and also has a low thermal resistance, it is suitable for use of forming the wiring used in printed electronics, the wiring of a touch panel, a transparent screen or the like, and the wiring of the circuit board of an in-vehicle device, a lighting device, a communication device, a game machine, an OA device, an industrial device, general household appliances or the like.

What is claimed is:

1. A composition for sintering, comprising:
silver nanoparticles;
an organic dispersant for coating the silver nanoparticles; and
a solvent,
wherein:
when the composition for sintering is heated, a weight loss rate in a range of 260° C. to 600° C. is 2.92% or less, and
when the composition for sintering is subjected to differential thermal analysis, no exothermic peak appears at 350° C. to 500° C.

2. The composition for sintering according to claim 1, wherein a maximum value of particle size distribution of the silver nanoparticles is 250 nm or less.

3. The composition for sintering according to claim 1, wherein a maximum value of particle size distribution of the silver nanoparticles is 200 nm or less.

4. The composition for sintering according to claim 1, wherein the weight loss rate is 2.46% or less.

5. The composition for sintering according to claim 1, wherein a boiling point of the solvent is less than 260° C.

6. The composition for sintering according to claim 5, wherein the boiling point of the solvent is a peak temperature when only the solvent is measured by a differential thermal analyzer.

7. The composition for sintering according to claim 1, wherein a minimum value of particle size distribution of the silver nanoparticles is 50 nm or less.

8. The composition for sintering according to claim 7, wherein the minimum value of particle size distribution of the silver nanoparticles is 10 nm or less.

9. The composition for sintering according to claim 1, wherein when the composition for sintering is measured by a differential thermal analyzer, two exothermic peaks appear in a range of 200° C. to 300° C.

10. The composition for sintering according to claim 9, wherein of the two exothermic peaks, an exothermic peak on a low temperature side is the exothermic peak at least indicating evaporation of the solvent, and an exothermic peak on a high temperature side is the exothermic peak indicating sintering of the silver nanoparticles.

11. The composition for sintering according to claim 1, wherein the organic dispersant is polyvinyl pyrrolidone.

12. The composition for sintering according to claim 1, wherein the solvent is polyethylene glycol.

13. A method for manufacturing a circuit board, comprising:
applying the composition for sintering according to claim 1 on a substrate, to form a film; and
sintering the silver nanoparticles contained in the composition for sintering by heating the film, to form a wiring.

14. A circuit board comprising:
a substrate; and
wiring mounted on the substrate,
wherein:
at least a part of the wiring is made of a conductive material obtained by sintering silver nanoparticles,
the wiring includes voids between the sintered silver nanoparticles and the silver nanoparticles,
a ratio occupied by the voids in a cross-section of the wiring is 24.0% or less, and
a sum of peripheral edge lengths of all the voids in a unit area (2500 nm square) of the cross-section of the wiring is 117 nm or more and 331 nm or less.

15. The circuit board according to claim 14, wherein the ratio occupied by the voids in the cross-section of the wiring is 15.9% or less.

16. The circuit board according to claim 14, wherein a diameter of the silver nanoparticles is 100 nm or less.

17. A circuit board comprising:
a substrate; and
wiring mounted on the substrate,
wherein:
at least a part of the wiring is made of a conductive material obtained by sintering silver nanoparticles,
the wiring includes voids between the sintered silver nanoparticles and the silver nanoparticles,
a ratio occupied by the voids in a cross-section of the wiring is 24.0% or less, and
the ratio occupied by the voids in the cross-section of the wiring is 8.8% or more.

18. The circuit board according to claim 17, wherein the ratio occupied by the voids in the cross-section of the wiring is 15.9% or less.

19. The circuit board according to claim 17, wherein a diameter of the silver nanoparticles is 100 nm or less.

20. The circuit board according to claim 17, wherein a sum of peripheral edge lengths of all the voids in a unit area (2500 nm square) of the cross-section of the wiring is 117 nm or more and 331 nm or less.

21. A method for producing silver nanoparticles for a composition for sintering that includes the silver nanoparticles, an organic dispersant for coating the silver nanoparticles, and a solvent, wherein when the composition for sintering is heated, a weight loss rate in a range of 260° C. to 600° C. is 2.92% or less, and wherein when the composition for sintering is subjected to differential thermal analysis, no exothermic peak appears at 350° C. to 500° C., the method comprising:
depositing the silver nanoparticles coated with the organic dispersant by dropping a silver ion solution containing silver ions into an organic dispersant solution obtained by dissolving the organic dispersant in the solvent,
wherein by adjusting an amount of the organic dispersant dissolved in the solvent, the silver nanoparticles are produced so that the weight loss rate in the range of 260° C. to 600° C. is 2.92% or less when the composition for sintering is heated.

* * * * *